(12) United States Patent
Wang et al.

(10) Patent No.: US 11,164,778 B2
(45) Date of Patent: Nov. 2, 2021

(54) BARRIER-FREE VERTICAL INTERCONNECT STRUCTURE

(71) Applicant: International Business Machines Corporation, Armonk, NY (US)

(72) Inventors: Junli Wang, Slingerlands, NY (US); Hsueh-Chung Chen, Cohoes, NY (US); Su Chen Fan, Cohoes, NY (US); Yann Mignot, Slingerlands, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 16/693,610

(22) Filed: Nov. 25, 2019

(65) Prior Publication Data
US 2021/0159117 A1   May 27, 2021

(51) Int. Cl.
*H01L 21/768* (2006.01)
*H01L 23/532* (2006.01)
(Continued)

(52) U.S. Cl.
CPC .. *H01L 21/76846* (2013.01); *H01L 21/31144* (2013.01); *H01L 21/7684* (2013.01); *H01L 21/76802* (2013.01); *H01L 21/76834* (2013.01); *H01L 21/76858* (2013.01); *H01L 21/76871* (2013.01); *H01L 21/76877* (2013.01);
(Continued)

(58) Field of Classification Search
None
See application file for complete search history.

(56) References Cited

U.S. PATENT DOCUMENTS 6,016,000 A    1/2000  Moslehi
6,300,236 B1  10/2001  Harper
(Continued)

OTHER PUBLICATIONS

"Method of Forming Interconnects with Mn-based Self-Formed Barriers and Varying Concentrations of Mn", An IP.com Prior Art Database Technical Disclosure, Disclosed Anonymously, IP.com No. IPCOM000256533D, IP.com Electronic Publication Date: Dec. 6, 2018, 3 pages.
(Continued)

*Primary Examiner* — Alexander G Ghyka
(74) *Attorney, Agent, or Firm* — Michael A. Petrocelli

(57) ABSTRACT

A semiconductor device includes a first interconnect structure formed in an $M_X$ level of the semiconductor device, the $M_X$ level includes a third interlevel dielectric layer located above a second capping layer, a first trench within the third interlevel dielectric layer extending through the second capping layer to expose a top surface of a contact structure located below the second capping layer, the contact structure is located within a second interlevel dielectric layer, a second metal liner conformally deposited within the first trench, and a first seed layer conformally deposited above the second metal liner, the first seed layer includes a metal manganese film. A first thermal annealing process is conducted on the semiconductor device to form a first barrier liner underneath the second metal liner to prevent diffusion of conductive metals.

6 Claims, 14 Drawing Sheets

(51) Int. Cl.
*H01L 21/8234* (2006.01)
*H01L 21/311* (2006.01)
*H01L 23/528* (2006.01)
*H01L 23/522* (2006.01)
*H01L 21/321* (2006.01)

(52) U.S. Cl.
CPC .......... *H01L 21/76886* (2013.01); *H01L 21/823475* (2013.01); *H01L 23/528* (2013.01); *H01L 23/5226* (2013.01); *H01L 23/5329* (2013.01); *H01L 23/53209* (2013.01); *H01L 23/53238* (2013.01); *H01L 23/53252* (2013.01); *H01L 21/3212* (2013.01)

(56) References Cited

U.S. PATENT DOCUMENTS

| | | | |
|---|---|---|---|
| 8,907,483 | B2 | 12/2014 | Zhao |
| 10,204,829 | B1 | 2/2019 | Amanapu |
| 2008/0160755 | A1 | 7/2008 | Joo |
| 2013/0320544 | A1* | 12/2013 | Lin ............... H01L 23/5329 257/758 |
| 2014/0299988 | A1 | 10/2014 | Cabral, Jr. |
| 2015/0108646 | A1 | 4/2015 | Chae |
| 2017/0092589 | A1* | 3/2017 | Chen ............... H01L 21/76843 |
| 2017/0194244 | A1* | 7/2017 | Zhang ............... H01L 23/53257 |
| 2017/0236781 | A1 | 8/2017 | Briggs |
| 2019/0006230 | A1 | 1/2019 | Kuo |
| 2019/0035634 | A1 | 1/2019 | Adusumilli |

OTHER PUBLICATIONS

"Novel Insitu Cap_ULK Cap Structure with Maganese Silicate_ SiCNH Dielectrics/Liner for Robust Linerless Nano Cu_Low K Interconnect", An IP.com Prior Art Database Technical Disclosure, Disclosed Anonymously, IP.com No. IPCOM000248787D, IP.com Electronic Publication Date: Jan. 11, 2017, 5 pages.

KUDO et a., "Copper Wiring Encapsulation with Ultra-thin Barriers to Enhance Wiring and Dielectric Reliabilities for 32-nm Nodes and Beyond", 2007 IEEE International Electron Devices Meeting, pp. 513-516.

Nogami et al., "Through-Cobalt Self Forming Barrier (tCoSFB) for Cu/ULK BEOL: A Novel Concept for Advanced Technology Nodes", 2015 IEEE International Electron Devices Meeting (IEDM), pp. 8.8.1-8.1.4.

Ohoka et al., "Integration of High Performance and Low Cost Cu/Ultra Low-k SiOC(k=2.0) Interconnects with Self-formed Barrier Technology for 32nm-node and Beyond", 2007 IEEE International Interconnect Technology Conference, pp. 67-69.

* cited by examiner

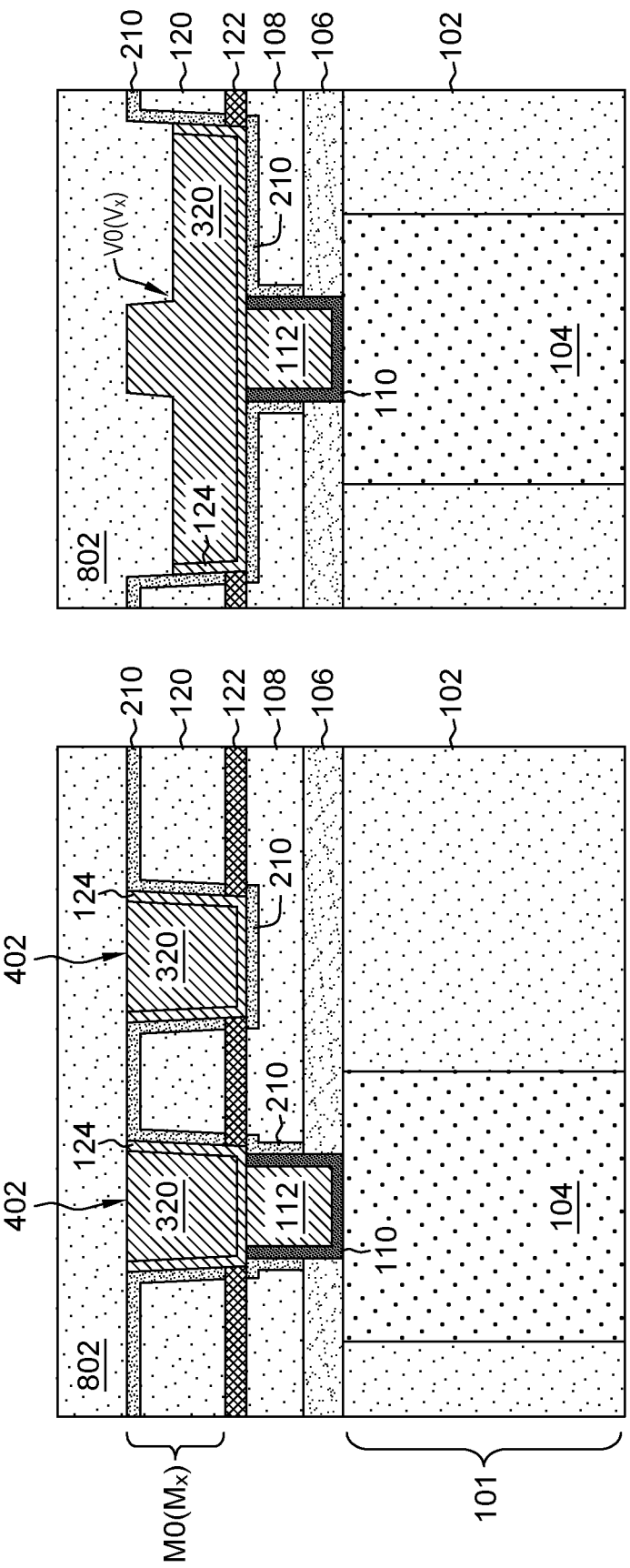

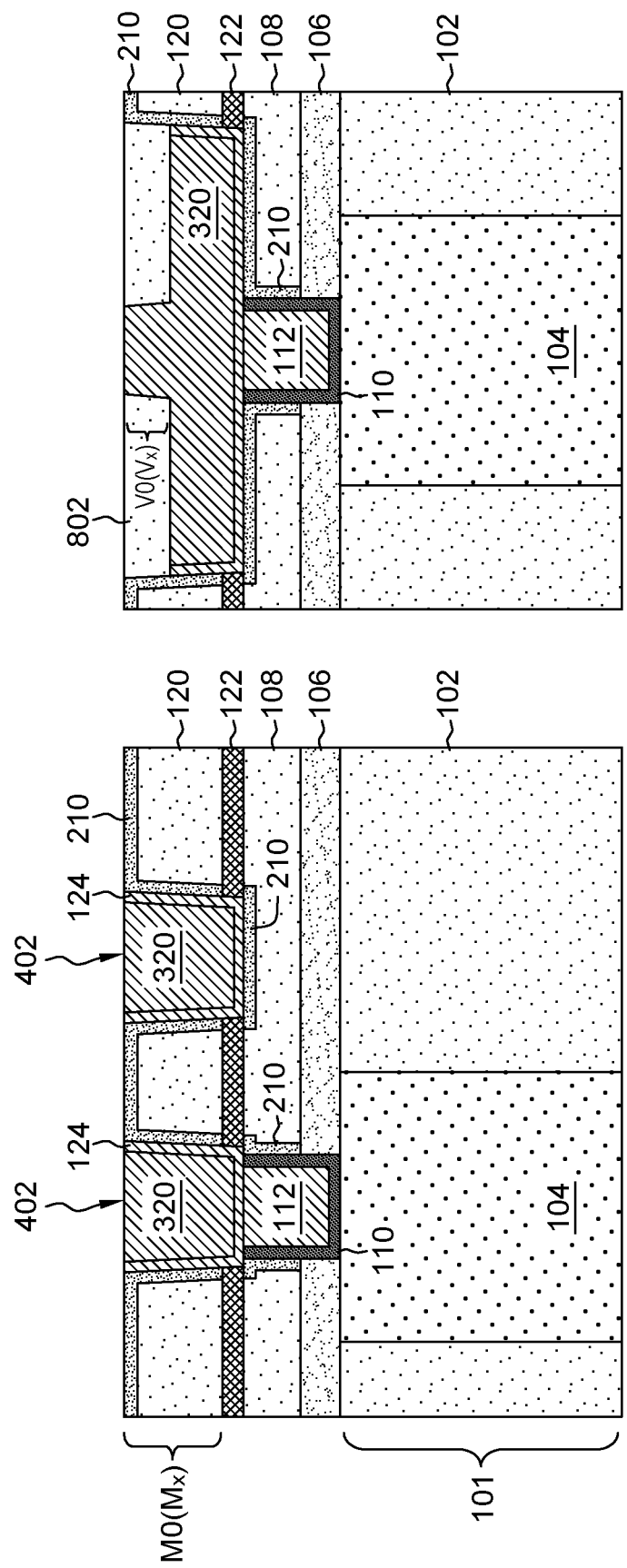

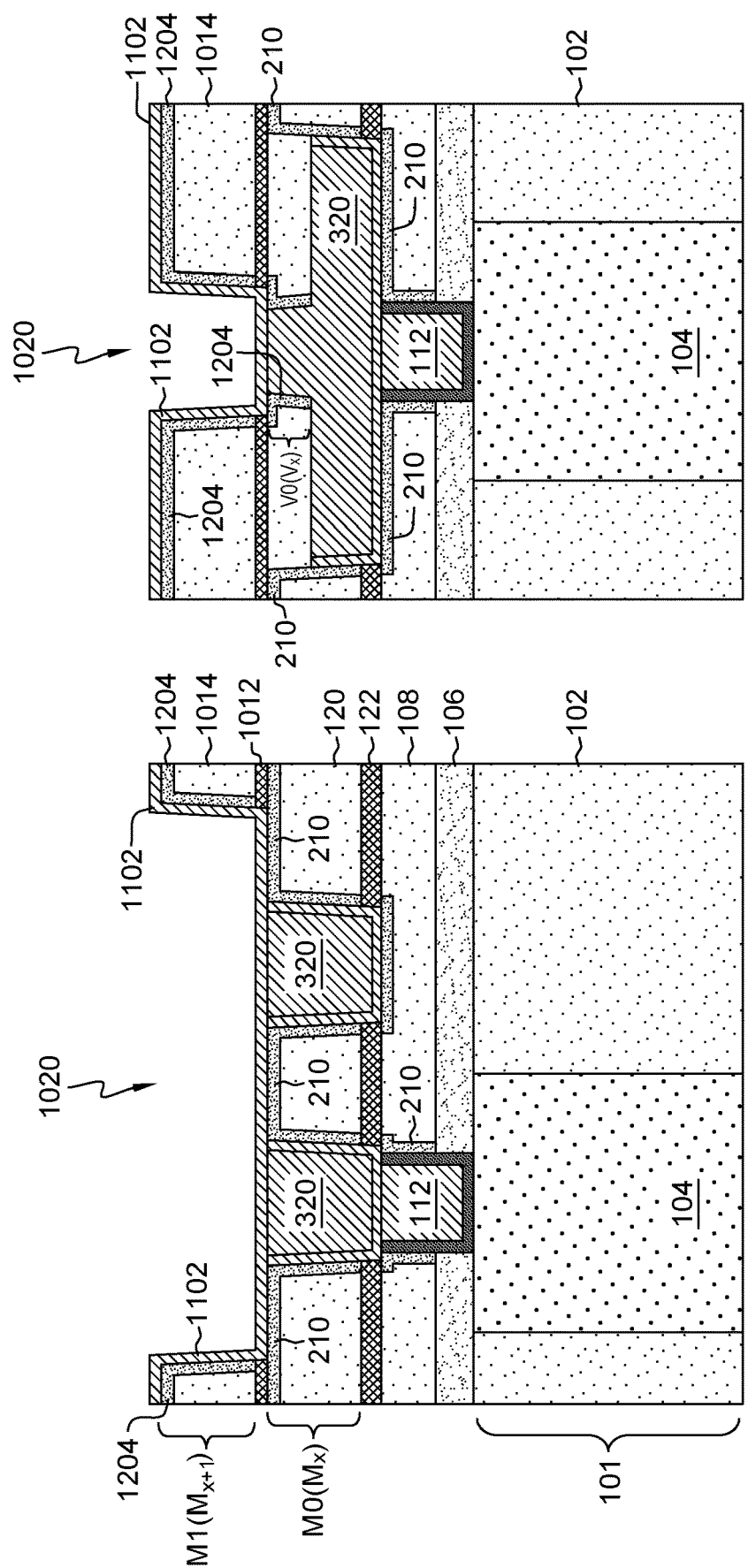

BARRIER-FREE VERTICAL INTERCONNECT STRUCTURE

BACKGROUND

The present invention generally relates to the field of complementary metal-oxide semiconductor (CMOS) devices, and more particularly to fabricating vertical interconnect structures.

Typical components of an integrated circuit (IC) include transistors, capacitors, and the like. In order for these circuit components to function as part of the overall IC, an electrical connection or interconnect structure to the circuit components must be formed. In the case of transistors, this may typically involve forming interconnect structures to the gate and source/drain regions. IC devices include a large number of circuit components arranged in a very complex layout. Therefore, an electrical connection or line arrangement cannot be established for each circuit component within the same device level in which the circuit components are formed. Accordingly, interconnect structures are formed in one or more additional stacked metallization layers formed above the device level, which constitute the overall line pattern of the IC. These metallization layers typically include conductive metal lines or vias formed within a layer of dielectric material.

In general, the metal lines (also referred to as wiring lines) provide electrical connections within the same metal level, and the conductive vias provide inter-level or vertical connections between different (metal) line levels. The metal lines and conductive vias are typically formed by etching a recess in the layer of dielectric material and filling the recess with a metal such as copper, tungsten, aluminum, etc., and corresponding barrier layers. The first metallization layer is often referred to as the M1 layer. Typically, a plurality of conductive vias (i.e., V0 vias) are used to establish an electrical connection between the M1 layer and the underlying device level contacts (e.g., CA/CB contacts). In advanced IC fabrication, another metallization layer (referred to as M0 layer) composed primarily of metal lines is formed between the device level contacts and the V0 via.

Interconnect structures (i.e., metal lines and vias) are typically formed using single-damascene or dual-damascene fabrication processes. In the single-damascene process, interconnect structures are manufactured independently, while in the dual-damascene process are manufactured at the same time. A single-damascene scheme is generally used to pattern the M0 layer in advance IC manufacturing. However, a thickness of the barrier liner(s) typically formed between device level contacts, M0 layer, and V0 via(s) in single-damascene schemes can substantially increase a vertical resistance of the IC device. Therefore, alternative designs and techniques of forming IC devices would be desirable.

SUMMARY

Shortcomings of the prior art are overcome and additional advantages are provided through the provision of a method of forming a semiconductor device that includes forming a first interconnect structure in an $M_X$ level of the semiconductor device that includes depositing a third interlevel dielectric layer located above a second capping layer, forming a first trench within the third interlevel dielectric layer, the first trench extending through the second capping layer to expose a top surface of a contact structure located below the second capping layer, the contact structure is located within a second interlevel dielectric layer, conformally depositing a second metal liner within the first trench, conformally depositing a first seed layer directly above the second metal liner, the first seed layer includes a metal manganese film, and conducting a first thermal annealing process on the semiconductor device to form a first barrier liner underneath the second metal liner to prevent diffusion of conductive metals.

Another embodiment of the present disclosure provides a semiconductor device that includes an $M_X$ level including a first interconnect structure, the first interconnect structure located within a third interlevel dielectric layer, the first interconnect structure includes a first conductive material, an $M_{X+1}$ level above the $M_X$ level, the $M_{X+1}$ level including a second interconnect structure located within a fourth interlevel dielectric layer, the second interconnect structure including a second conductive material, and a barrier liner located at interface between the first interconnect structure and the third interlevel dielectric layer, at an interface between the second interconnect structure and the fourth interlevel dielectric layer, on a top surface of the third interlevel dielectric layer underneath the second interconnect structure, and on a top surface of the fourth interlevel dielectric layer.

BRIEF DESCRIPTION OF THE DRAWINGS

The following detailed description, given by way of example and not intended to limit the invention solely thereto, will best be appreciated in conjunction with the accompanying drawings, in which:

FIG. 8 is a cross-sectional view of the IC device depicting the deposition of a filling material, according to an embodiment of the present disclosure;

FIG. 8A is a cross-sectional view of FIG. 8 taking along the Y-plane, according to an embodiment of the present disclosure;

FIG. 9 is a cross-sectional view of the IC device after a second planarization process to remove portions of the filling material, according to an embodiment of the present disclosure;

FIG. 9A is a cross-sectional view of FIG. 9 taking along the Y-plane, according to an embodiment of the present disclosure;

FIG. 12 is a cross-sectional view of the IC device depicting the formation of a second barrier liner after a second thermal annealing process, according to an embodiment of the present disclosure;

FIG. 12A is a cross-sectional view of FIG. 12 taking along the Y-plane, according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
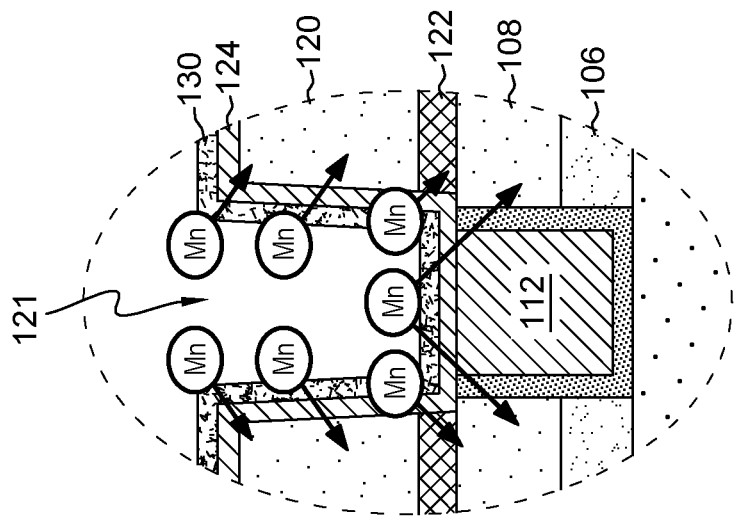
FIG. 1A is a close-up view of a region of the IC device depicting migration of manganese atoms from the first seed layer during a first thermal annealing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present disclosure provide a method and associated structure for fabricating vertical interconnect structures with reduced vertical resistance. The proposed embodiments eliminate the (thicker) barrier liner typically formed between device level contact(s), M0 layer, and V0 via(s) during current single-damascene schemes from the integrated circuit (IC) device. By doing this, a vertical resistance of the IC device can be substantially reduced thereby improving performance and reliability of advanced IC devices. A way of eliminating the (thicker) barrier liner typically formed between device level contact(s), M0 layer, and V0 via(s) from the integrated circuit (IC) device includes forming a seed layer of a barrier-forming material such as manganese (Mn) directly above a metal liner (e.g., cobalt liner), annealing the IC device to cause manganese atoms to migrate through the metal liner into a silicon-containing interlevel dielectric layer in which manganese atoms react with silicon atoms in the silicon-containing dielectric layer to form a manganese silicate layer that may act as a diffusion barrier. An embodiment by which the manganese silicate layer can be formed is described in detailed below by referring to the accompanying drawings in FIGS. 1-14A.

Figure 1:
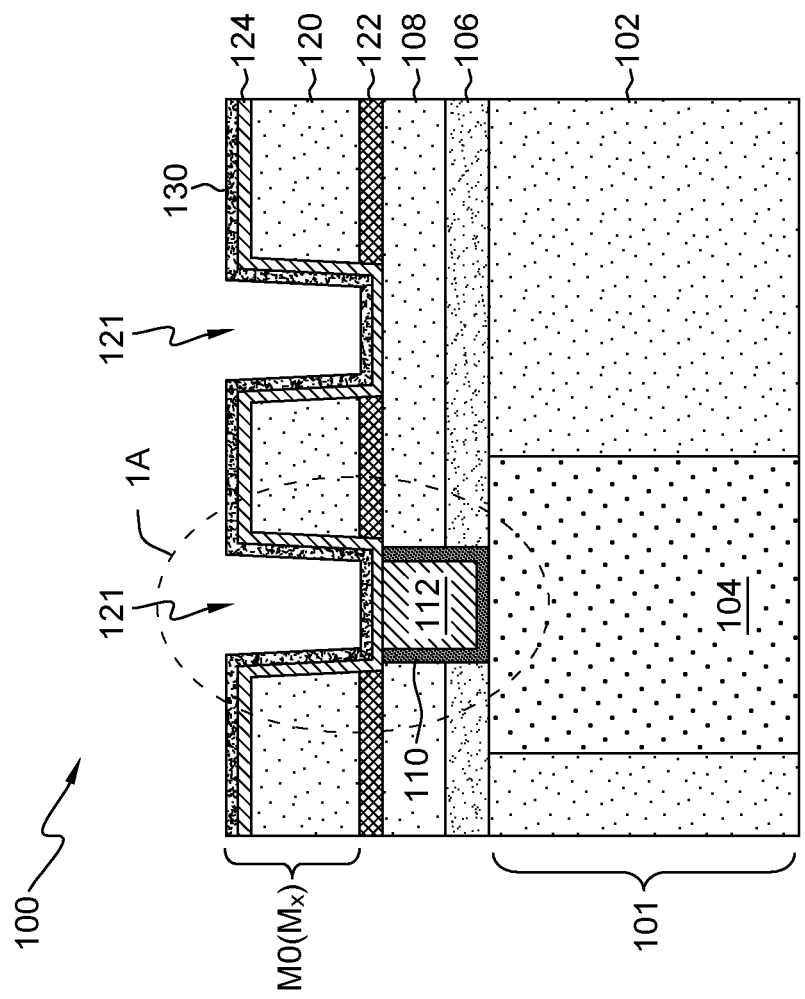
FIG. 1 is a cross-sectional view of an integrated circuit (IC) device depicting the deposition of a first seed layer, according to an embodiment of the present disclosure.

Referring now to FIG. 1, a cross-sectional view of an integrated circuit (IC) device 100 is shown, according to an embodiment of the present disclosure. At this step of the manufacturing process, the IC device 100 may consist of a finished device level 101 (hereinafter "device level") in which a plurality of field effect transistors devices 104 are formed. For illustration purposes only, without intent of limitation, only one field effect transistor device 104 is shown in the figure. As known by those skilled in the art, the field effect transistor device 104 may include a variety of different configurations, e.g., planar transistor devices, finFET transistor devices, nanowire transistor devices, and the like. Field effect transistors (FETs) such as the field effect transistor device 104, are typically operated on a switched mode, that is, these devices exhibit a highly conductive state (on-state) and a high impedance state (off-state). Typically, the on/off state of field effect transistors is controlled by a gate electrode (not shown), which controls, upon application of an appropriate control voltage, the conductivity of a channel region (not shown) formed between a drain region (not shown) and a source region (not shown). In addition to active circuit elements or semiconductor devices such as the field effect transistor device 104, the device level 101 of the IC device 100 may also include passive circuit elements (not shown) such as resistors, capacitors, etc.

A first interlevel dielectric layer 102 separates the field effect transistor device 104 from other circuit elements or devices (including other field effect transistor devices 104) located in the device level 101. The first interlevel dielectric layer 102 may include, for example, a low-k dielectric material having a dielectric constant, k, in the range of approximately 2.4 to approximately 2.7. In some embodiments, the first interlevel dielectric layer 102 may include silicon oxide, silicon nitride, hydrogenated silicon carbon oxide, silicon based low-k dielectrics, or porous dielectrics. The first interlevel dielectric layer 106 may be formed by any suitable deposition process such as, for example, chemical vapor deposition (CVD), physical vapor deposition (PVD), and the like.

A first capping layer 106 may be formed above the device level 101. The first capping layer 106 may include an insulator of silicon nitride, silicon carbide, nitrogen doped silicon carbide, oxygen doped silicon carbide or the like, which may function as both a barrier and an etch stop. In the depicted embodiment, the first capping layer 106 is made of silicon nitride. The first capping layer 106 may be deposited above the device level 101 by any suitable deposition method known in the art. The first capping layer 106 may have a thickness varying from approximately 5 nm to approximately 30 nm and ranges there between, although a thickness less than 5 nm and greater than 30 nm may be acceptable.

According to an embodiment, the IC device 100 may also include a contact structure 112 for establishing an electrical connection to the simplistically depicted field effect transistor device 104. For illustration purposes only, without intent of limitation, only one contact structure 112 is shown, it may be understood that numerous contact structures 112 (i.e., device level contacts) may be formed in the IC device 100 to electrically connect existing field effect transistor devices in the device level 101 to upper metal levels.

As known by those skilled in the art, according to a circuit design the contact structure 112 may be, in some embodiments, a source/drain or CA contact for establishing an electrical connection to source/drain regions (not shown) of the field effect transistor device 104. In other embodiments, the contact structure 112 may be a gate or CB contact for establishing an electrical connection to a gate structure (not shown) of the field effect transistor device 104. It should be noted that the process of forming the contact structure 112 is standard and well-known in the art. Generally, the process includes depositing a second interlevel dielectric layer 108 above the first capping layer 106, forming various trenches in the second interlevel dielectric layer 108 using standard patterning (lithography) and etching techniques until active regions of the field effect transistor device 104 are exposed, and then filling the various trenches with a contact metal such as, but not limited to, titanium (Ti), Cobalt (Co), Ruthenium (Ru), copper (Cu), nickel (Ni), platinum (Pt) and/or tungsten (W) using well-known conformal deposition processes, such as atomic layer deposition (ALD), CVD or PVD. In this embodiment, the contact metal filling the contact structure 112 may include tungsten (W), cobalt (Co) or ruthenium (Ru). In some embodiments, one or more metallic barrier layers, such as first metal liner 110, may be formed in the contact structure 112 prior to deposition of the contact metal. According to an embodiment, the first metal liner 110 is made of titanium nitride (TiN), although other materials may also be considered. The second interlevel dielectric layer 108 include analogous materials and is formed in a similar way as the first interlevel dielectric layer 102.

With continued reference to FIG. 1, a second capping layer 122 may be formed in the IC device 100. Similar to the first capping layer 106, the second capping layer 122 may include an insulator of silicon nitride, silicon carbide, nitrogen doped silicon carbide, oxygen doped silicon carbide, metal oxide (for example $AlO_X$ or $HfO_X$) or the like which may function as both a barrier, particularly when a low-k material that may be subject to diffusion of moisture is used as interlevel dielectric (ILD), and an etch stop for a subsequent via level. In some embodiments, the second capping layer 122 may include a dielectric material such as nitrogen-doped silicon carbide (NBLoK).

Also depicted in FIG. 1 are first trenches or metal patterns 121 formed in a third interlevel dielectric layer 120 in preparation for forming a first metal layer or $M_X$ metal level of the IC device 100. As may be understood by those skilled in the art, embodiments of the present disclosure can be implemented during the fabrication of a first metal level $M_X$, a first via level $V_X$ and subsequent metal levels $M_{X+1}$ of IC devices such as the IC device 100. In this embodiment the first metal layer or $M_X$ metal level corresponds to a M0 metal layer. The first metal patterns 121 may be shaped to accommodate a variety of interconnect structures (e.g., lines or vias) and may extend through the second capping layer 122 to expose the contact structure 112. The M0 metal layer is formed in the third interlevel dielectric layer 120 (e.g., a low-k insulating material), between the contact structure 112 (i.e., the device level contacts) and a subsequently formed (V0) via level. The M0 metal layer typically includes a plurality of metal lines that are routed as needed across the IC device 100. In advanced semiconductor manufacturing, the formation of the M0 metal layer may be helpful in reducing the overall resistance of the circuits forming the IC device 100.

The third interlevel dielectric layer 120 may include analogous materials and may be formed in a similar way as the first and second interlevel dielectric layers 102, 108. In some embodiments, the third interlevel dielectric layer 120 may be formed taking into consideration a target via height and/or thickness.

The first metal patterns 121 are generally formed using lithography and etch processing techniques typically used in single-damascene and dual-damascene processes. In preparation for depositing an M0 metal layer, the first metal patterns 121 may expose a top of the contact structure 112. In an embodiment, the third interlevel dielectric layer 120 may be an oxide material and an oxide etch is performed to form the first metal patterns 121, along with etching the contact metal of the contact structure 112.

A second metal liner 124 may be conformally deposited within the first metal patterns 121, as shown in the figure. Specifically, the second metal liner 124 may be formed above and in direct contact with substantially all exposed surfaces of the IC device 100. The second metal liner 124 may adhere to the third interlevel dielectric layer 120 and uppermost portion of the contact structure 112. The second metal liner 124 may act as a nucleation layer for the growth of subsequent fill materials. In an embodiment, the second metal liner 124 is composed substantially of, if not entirely of, cobalt (Co). In another embodiment, the second metal liner 124 is composed substantially of, if not entirely of, ruthenium (Ru). In yet another other embodiment, the second metal liner 124 can be composed of a cobalt-based compound or alloy material. The second metal liner 124 may be formed using standard deposition processes such as PVD, CVD, electroless plating, evaporation, or any other deposition method that deposits conformal thin films.

A thickness of the second metal liner 124 may vary from approximately 0.5 nm to approximately 5 nm and ranges there between, although a thickness less than 0.5 nm and greater than 5 nm may be acceptable. In an embodiment, the second metal liner 124 may have a thickness of approximately 3 nm.

Following the formation of the second metal liner 124, a first seed layer 130 may be formed directly above the second metal liner 124, as shown in FIG. 1. The first seed layer 130 may include a very thin layer of a barrier-forming material conformally deposited on the IC device 100. In a preferred embodiment, the first seed layer 130 is composed substantially of, if not entirely of, a metal manganese (Mn) film. A thickness of the first seed layer 130 may be substantially less than the thickness of the second metal liner 124. According to an embodiment, the first seed layer 130 may have a thickness of less than approximately 3 nm nm. In other embodiments, the first seed layer 130 may have a thickness varying from approximately 0.5 nm to approximately 5 nm. The first seed layer 130 can be formed by a CVD method using a pyrolysis reaction of a manganese compound gas, a CVD method using a manganese compound gas and a reducing reaction gas, or an ALD method.

Referring now to FIG. 1A, a close-up view of a region 140 (FIG. 1) of the IC device 100 is shown, according to an embodiment of the present disclosure. After depositing the first seed layer 130, a first thermal annealing process is performed on the IC device 100. The IC device 100 is subjected to a high temperature anneal using conventional processes. The annealing temperature may vary from approximately 200° C. to approximately 350° C., although other temperatures above or below this range may also be considered.

The close-up view of region 140 depicts details of the first seed layer 130 during the first thermal annealing process. As depicted in the figure, the first thermal annealing process may cause atoms of the barrier-forming material in the first seed layer 130 to migrate through the second metal liner 124 and first metal liner 110 into the third and second interlevel dielectric layers 120, 108, as illustrated in the figure. Particularly, in this embodiment, manganese (Mn) atoms from the first seed layer 130 migrate through the second metal liner 124 to an interface located between a bottom surface of the second metal liner 124 and upper portions of the third and second interlevel dielectric layers 120, 108. As illustrated in FIG. 1A, the manganese (Mn) atoms from the first seed layer 130 may also migrate through the first metal liner 110 of the contact structure 112 to an interface located between the first metal liner 110 and the second interlevel dielectric layer 108 (i.e., areas of the contact structure 112 adjacent or in direct contact with the second interlevel dielectric layer 108).

With continued reference to FIG. 1A, during the first thermal anneal process, the migrated manganese (Mn) atoms react with silicon (Si) atoms in the insulating material forming the second and third interlevel dielectric layers 108, 120 forming a barrier material that may prevent the diffusion of conductive metals (e.g., cobalt or copper) from the device level 101 and oxygen from the different interlevel dielectric layers in the M0 level layer. For instance, in embodiments in which the second and third interlevel dielectric layers 108, 120 are made of silicon dioxide ($SiO_2$), silicon atoms from these layers react with manganese atoms from the first seed layer 130 to form a manganese silicate layer ($MnSiO_3$) at the $Co/SiO_2$ interface. This manganese silicate layer (e.g., first barrier liner 210) may help eliminating the typically thicker bottom barrier liner formed in the M0 metal layer during traditional BEOL fabrication processes. Additionally, the formation of the $MnSiO_3$ layer may improve barrier layer effectiveness, enhance electric stability of the IC device 100, and improve adhesion of the subsequently deposited metal layers.

Figure 2:
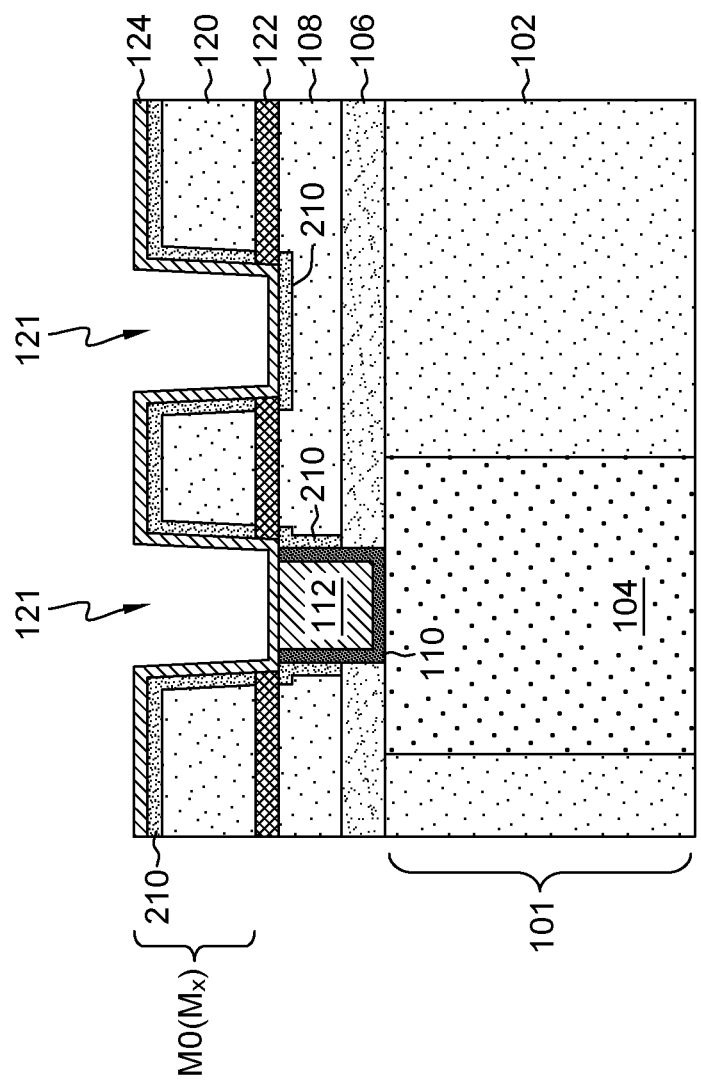
FIG. 2 is a cross-sectional view of the IC device depicting the formation of a first barrier liner, according to an embodiment of the present disclosure.

Referring now to FIG. 2, a cross-sectional view of the IC device 100 depicting the formation of a first barrier liner 210 underneath the second metal liner 124 is shown, according to an embodiment of the present disclosure. At this point of the manufacturing process, the first thermal annealing process has been completed, and substantially all atoms from the first seed layer 130 has migrated and reacted with the second interlevel dielectric layer 108 and the third interlevel dielectric layer 120 to form the first barrier liner 210 in the IC device 100. As explained above, the (self-forming) first barrier liner 210 may prevent the diffusion of conductive metals and oxygen to the M0 level layer. By forming the first barrier liner 210 in the way described above, the traditionally thicker barrier liner(s) can be eliminated, thereby reducing a vertical resistance of the IC device 100. Additionally, by promoting the formation of the first barrier liner 210, more space within the M0 level layer can be created for the deposition of conductive metals that may improve the reliability of the IC device 100. It should be noted that due to the reduced thickness of the first seed layer 130, substantially all the material forming the first seed layer 130 is consumed during the first thermal annealing process of FIGS. 1-1A.

According to an embodiment, the first barrier liner 210 may have a thickness varying from approximately 0.5 nm to approximately 5 nm and ranges there between, although a thickness less than 0.5 nm and greater than 5 nm may be acceptable.

Figure 3:
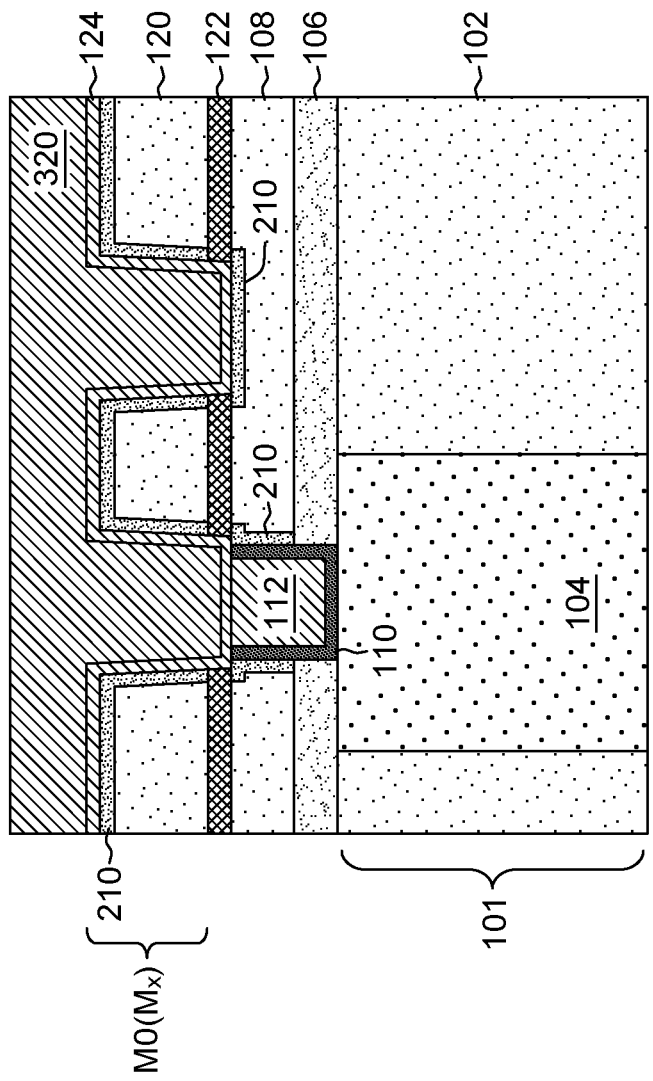
FIG. 3 is a cross-sectional view of the of the IC device depicting the formation of a first conductive material, according to an embodiment of the present disclosure.

Referring now to FIG. 3, a cross-sectional view of the IC device 100 depicting the formation of a first conductive material 320 is shown, according to an embodiment of the present disclosure. The first conductive material 320 may be conformally deposited directly above a top surface of the second metal liner 124. In this embodiment, the first conductive material 320 may be composed of cobalt (Co) or ruthenium (Ru). In another embodiment, the first conductive material 320 may include other metals such as copper (Cu), aluminum (Al), gold (Au), silver (Ag) and tungsten (W). In some embodiments, the first conductive material 320 may further include dopants such as, for example, manganese, magnesium, copper, aluminum, or other known dopants. The first conductive material 320 may be formed by electroplating, electroless plating, PVD, CVD, or any combination thereof.

A thickness of the first conductive material 320 may be enough to entirely fill the first trenches or metal patterns 121 of FIG. 2. However, in some cases, the thickness of the first conductive material 320 may exceed the depth of the first trenches or metal patterns 121 (FIG. 2) as shown in the figure. In these cases a planarization process can be conducted on the IC device 100 to remove areas of the first conductive material 320 exceeding the depth of the first metal patterns 121 (FIG. 2) as will be described in FIG. 4.

Figures 4, 4A:
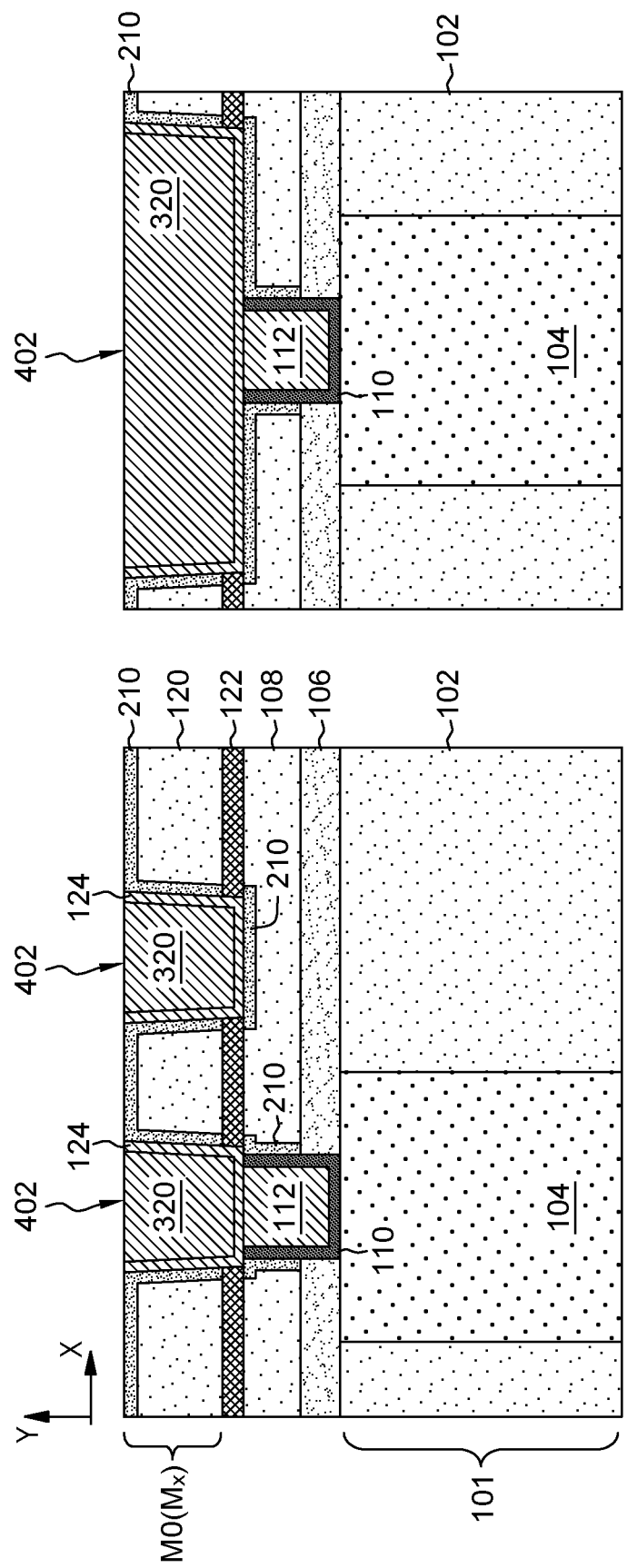
FIG. 4 is a cross-sectional view of the of the IC device after a first planarization process, according to an embodiment of the present disclosure.
FIG. 4A is a cross-sectional view of FIG. 4 taking along the Y-plane, according to an embodiment of the present disclosure.

Referring now to FIGS. 4-4A, cross-sectional views of the IC device 100 after a first planarization process are shown, according to an embodiment of the present disclosure. FIG. 4A is a cross-sectional view of FIG. 4 taking along the Y-plane. Specifically, excess portions of the first conductive material 320 and portions of the first barrier liner 124 parallel to the third interlevel dielectric layer 120 may be removed from the IC device 100 by any planarization method known in the art including, for example, chemical mechanical polishing (CMP).

The second metal liner 124 may also serve as a stop layer during planarization of the excess first conductive material 320. The first planarization process then may be a two step-process. The first step may include a self-stopping process to remove the excess first conductive material 320. The second step in the first planarization process may include removing the portions of the second metal liner 124 parallel to the third interlevel dielectric layer 120, this step exposes a top surface of the first barrier liner 210, as illustrated in FIG. 4. According to an embodiment, first conductive material 320 and second metal liner 124 may form first interconnect structures 402.

Figure 5A:
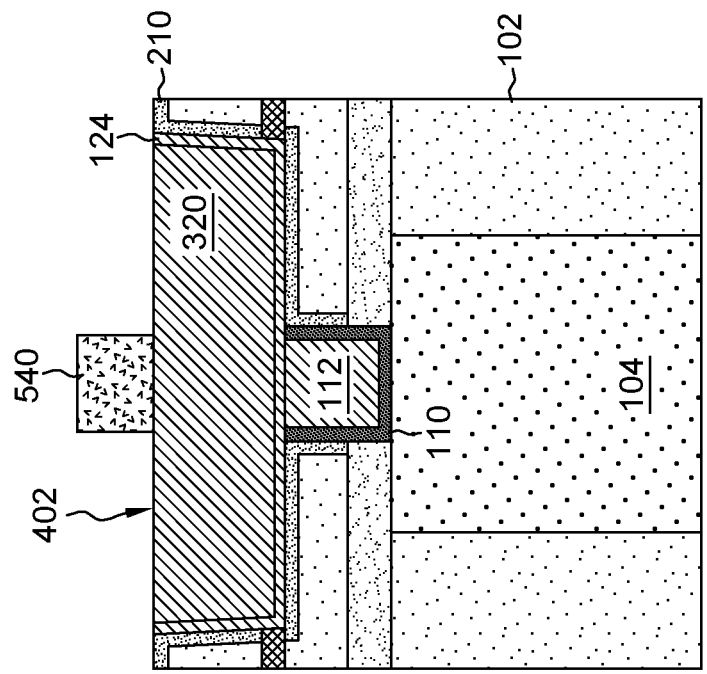
FIG. 5A is a cross-sectional view of FIG. 5 taking along the Y-plane, according to an embodiment of the present disclosure.
Figure 5:
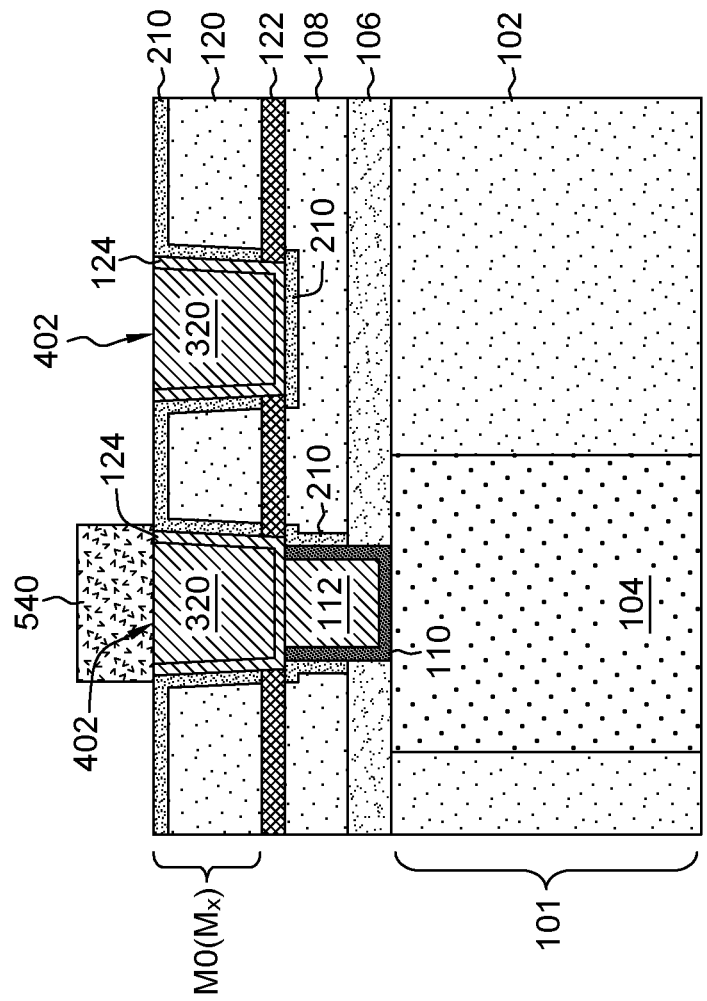
FIG. 5 is a cross-sectional view of the IC device depicting the formation of a mask, according to an embodiment of the present disclosure.

Referring now to FIGS. 5-5A, cross-sectional views of the IC device 100 depicting the formation of a mask 540 are shown, according to an embodiment of the present disclosure. FIG. 5A is a cross-sectional view of FIG. 5 taking along the Y-plane. The mask 540 may include a conventional lithography mask, or a hard mask (e.g., oxide or SiN) by tone inversion. The mask 540 may be formed on top of the first interconnect structure 402 positioned above the contact structure 112, as illustrated in the figure. Patterns are etched in the mask 540 such that the first conductive metal (M0 metal) can be etched to form a V0 via, as will be described in detail below with reference to FIG. 6.

Figure 6A:
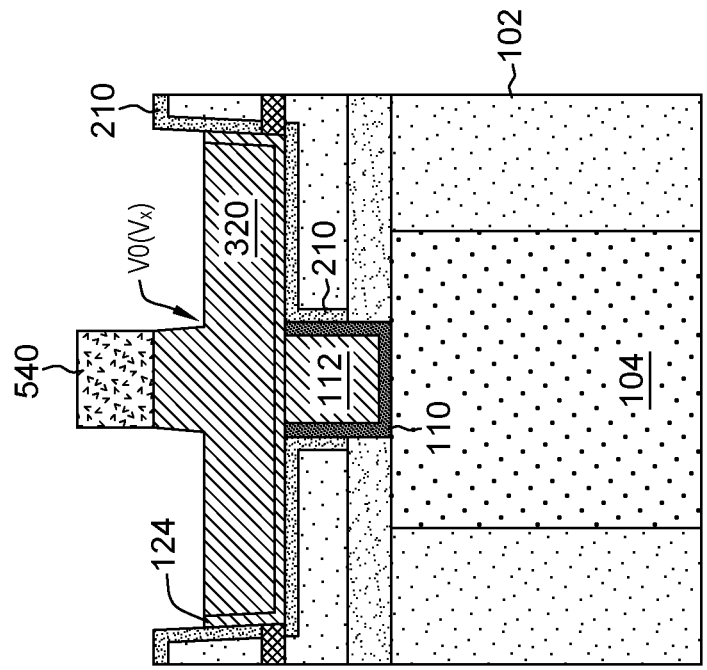
FIG. 6A is a cross-sectional view of FIG. 6 taking along the Y-plane, according to an embodiment of the present disclosure.
Figure 6:
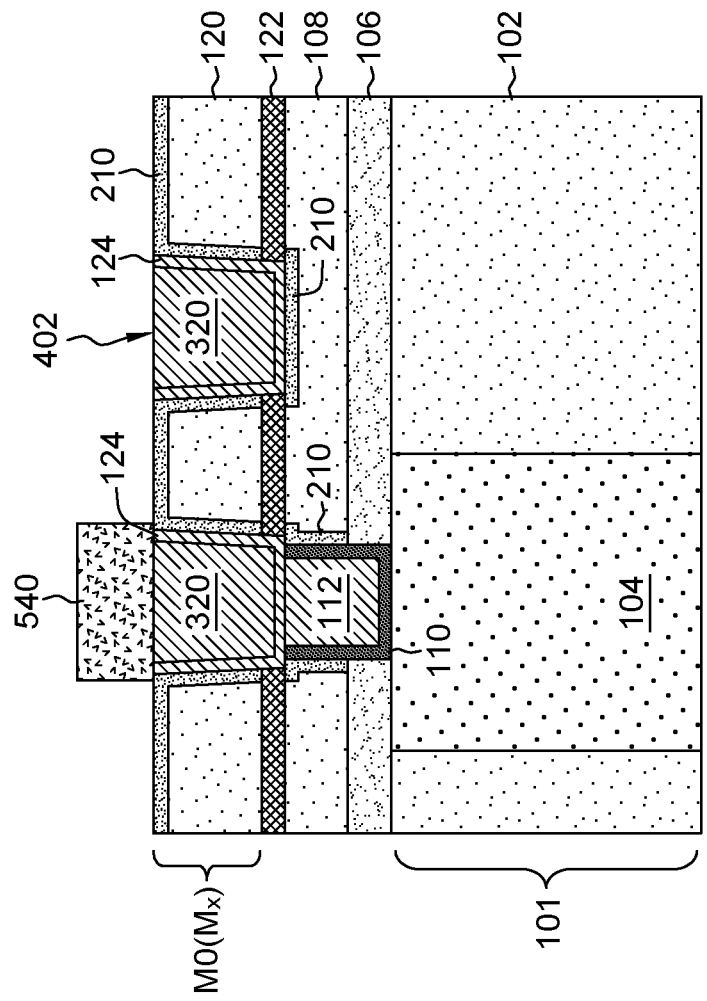
FIG. 6 is a cross-sectional view of the IC device depicting patterning of the first conductive material to form V0 via(s), according to an embodiment of the present disclosure.

Referring now to FIG. 6-6A, cross-sectional views of the IC device 100 depicting patterning of the first conductive material 320 are shown, according to an embodiment of the present disclosure. FIG. 6A is a cross-sectional view of FIG. 6 taking along the Y-plane. In this embodiment, the first conductive material 320 is recessed to form a V0 metal pattern or V0 via, as shown in the figure. It should be noted that, in this embodiment, the V0 via corresponds to a first via level or $V_X$ level of the IC device 100.

Figure 7:
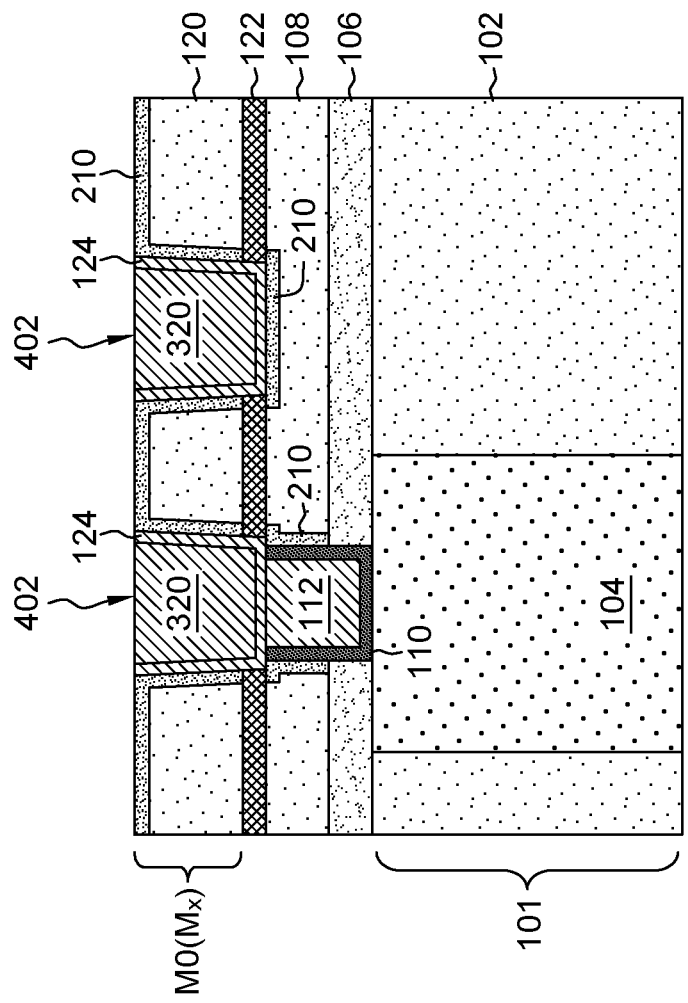
FIG. 7 is a cross-sectional view of the IC device depicting the removal of the mask, according to an embodiment of the present disclosure.
Figure 7A:
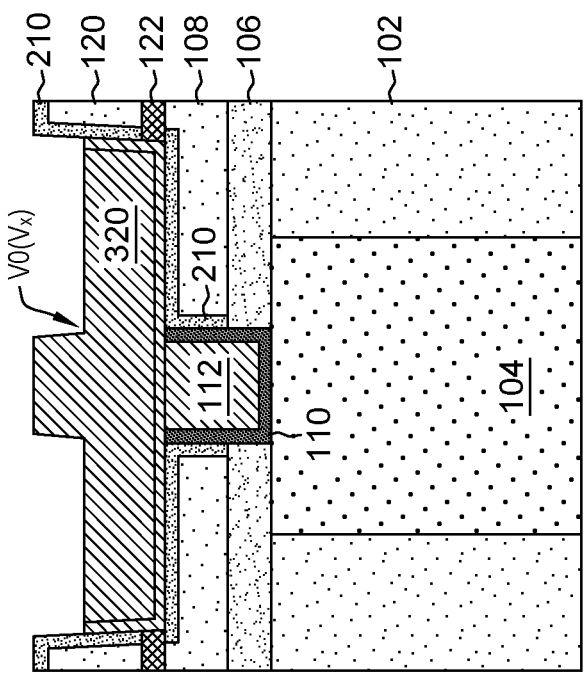
FIG. 7A is a cross-sectional view of FIG. 7 taking along the Y-plane, according to an embodiment of the present disclosure.

Referring now to FIGS. 7-7A, cross-sectional views of the IC device 100 depicting removal of the mask 540 are shown, according to an embodiment of the present disclosure. FIG. 7A is a cross-sectional view of FIG. 7 taking along the Y-plane. After patterning of the V0 via, the mask 540 is removed from the IC device 100 by any suitable removal technique.

After removing the mask 540, a filling material 802 (FIGS. 8-8A) is deposited to fill the recessed area of the first conductive material 320. As shown in FIGS. 8-8A, the filling material 802 covers the M0 metal layer. The filling material 802 may be, for example, a nitride material. Examples of the filling material 802 may include silicon nitride (SiN). As known by those skilled in the art, the filling material 802 is designed to define the V0 metal landing.

After depositing the filling material 802, a second planarization process is conducted on the IC device 100 to remove excess portions of the filling material 802 as shown in FIGS. 9-9A. Any suitable planarization process (e.g., CMP) can be used to remove the excess portions of the filling material 802.

The manufacturing process may continue with the formation of the next metal level $M_{X+1}$ (i.e., second metal level or M1 metal layer) of the IC device 100, as will be described in FIGS. 10-14A below.

Figure 10A:
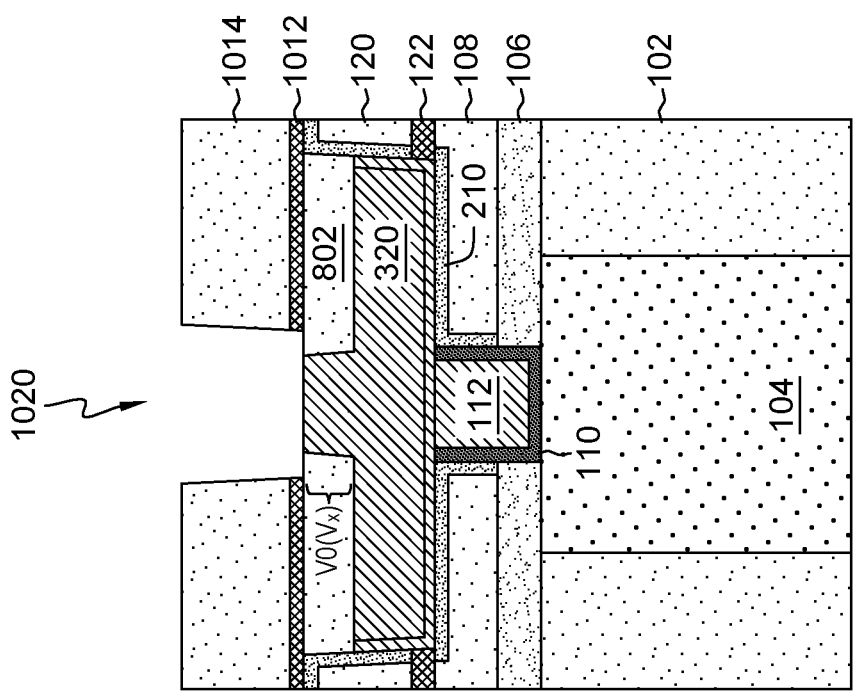
FIG. 10A is a cross-sectional view of FIG. 10 taking along the Y-plane, according to an embodiment of the present disclosure.
Figure 10:
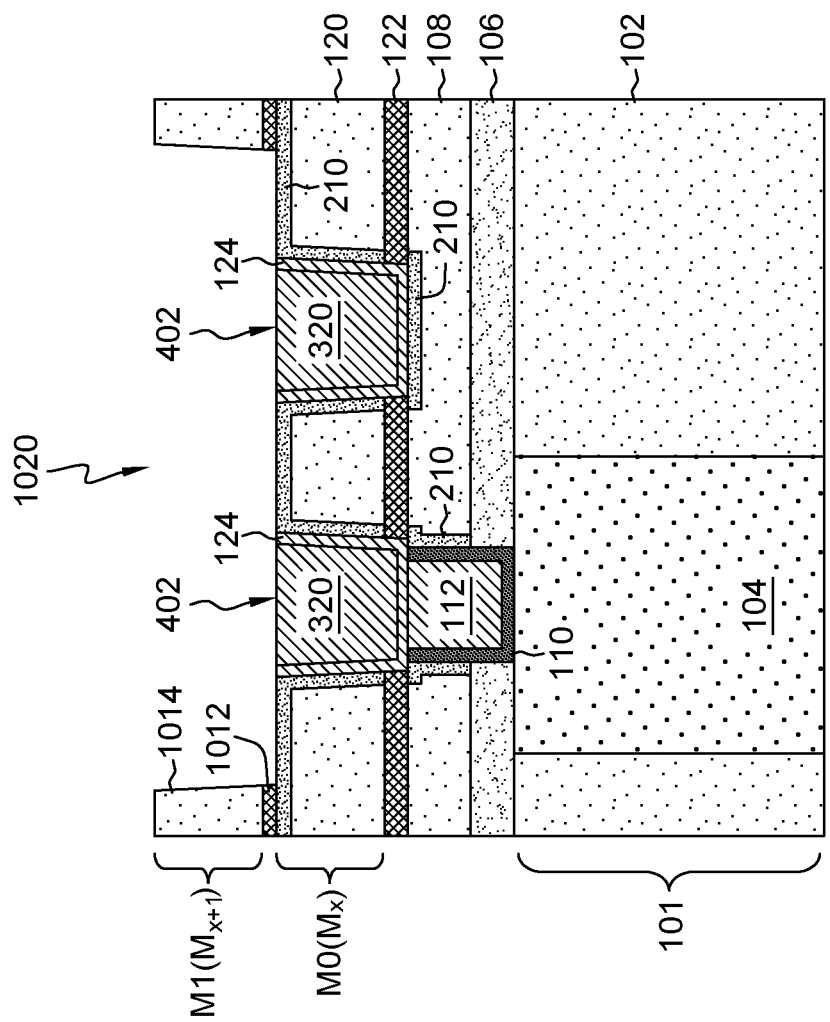
FIG. 10 is a cross-sectional view of the IC device depicting the formation of a M1 level layer, according to an embodiment of the present disclosure.

Referring now to FIGS. 10-10A, cross-sectional views of the IC device 100 depicting formation of a M1 metal layer are shown, according to an embodiment of the present disclosure. FIG. 10A is a cross-sectional view of FIG. 10 taking along the Y-plane. As known by those skilled in the art, at this point of the manufacturing process, a third capping layer 1012 is formed above the M0/V0 level layer of the IC device 100, followed by a fourth interlevel dielectric layer 1014. The third capping layer 1012 may be made of analogous materials and deposited in similar ways as the second capping layer 122. Similarly, the fourth interlevel dielectric layer 1014 includes analogous materials and is deposited in similar ways as the third dielectric layer 120.

Also depicted in FIGS. 10-10A are second trenches or metal patterns 1020 formed in the fourth interlevel dielectric layer 1014 in preparation for forming the M1 metal layer of the IC device 100. The second metal patterns 1020 may be shaped to accommodate a variety of interconnect structures (e.g., lines or vias) selected based on the circuit design. The second metal patterns 1020 may extend through the third capping layer 1012 exposing a top surface of the M0/V0 level layer, as shown in the figure. Specifically, the first interconnect structures 402 including the V0 via are exposed after formation of the metal patterns 1020 in the IC device 100. Similarly to the first metal patterns 121, the second metal patterns 1020 are generally formed using lithography and etch processing techniques typically used in single-damascene and dual-damascene processes.

Figure 11A:
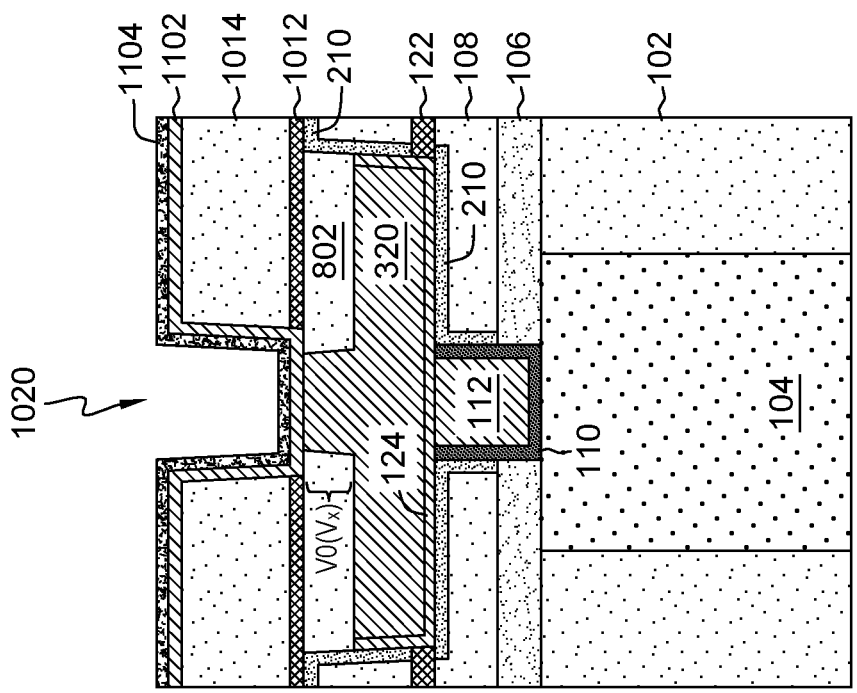
FIG. 11A is a cross-sectional view of FIG. 11 taking along the Y-plane, according to an embodiment of the present disclosure.
Figure 11:
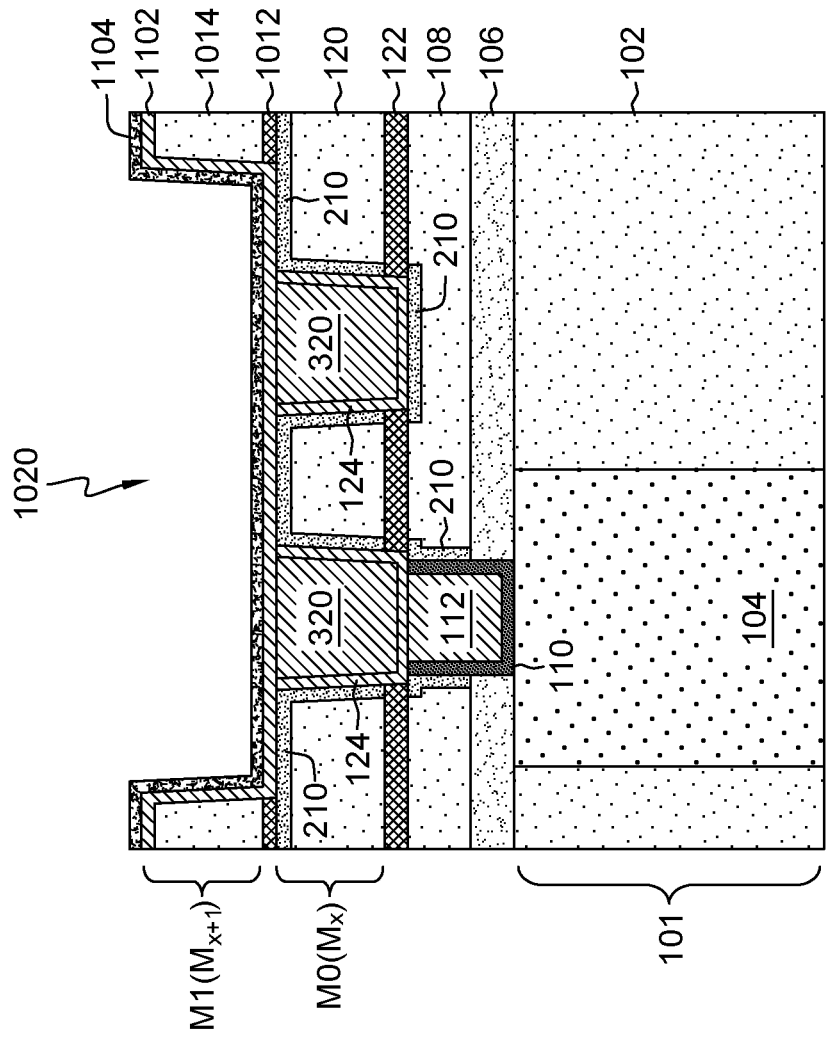
FIG. 11 is a cross-sectional view of the IC device depicting the formation of a third metal liner and a second seed layer, according to an embodiment of the present disclosure.

Referring now to FIGS. 11-11A, cross-sectional views of the IC device 100 depicting the formation of a third metal liner 1102 and a second seed layer 1104 are shown, according to an embodiment of the present disclosure. FIG. 11A is a cross-sectional view of FIG. 11 taking along the Y-plane. The third metal liner 1102 may be conformally deposited within the second metal patterns 1020, as shown in the figure. Specifically, the third metal liner 1102 may be formed above and in direct contact with substantially all exposed surfaces of the IC device 100.

As described above, the third metal liner 1102 may act as a nucleation layer for the growth of subsequent fill materials. In an embodiment, the third metal liner 1102 is composed substantially of, if not entirely of, cobalt (Co). In another embodiment, the third metal liner 1102 is composed substantially of, if not entirely of, ruthenium (Ru). In other embodiments, the third metal liner 1102 can be composed of a cobalt-based or ruthenium-based compound or alloy material. The third metal liner 1102 may be formed using standard deposition processes such as PVD, CVD, electroless plating, evaporation, or any other deposition method that deposits conformal thin films.

A thickness of the third metal liner 1102 may vary from approximately 0.5 nm to approximately 5 nm and ranges there between, although a thickness less than 0.5 nm and greater than 5 nm may be acceptable. In an embodiment, the third metal liner 1102 may have a thickness of approximately 3 nm.

Following the formation of the third metal liner 1102, a second seed layer 1104 may be formed directly above the third metal liner 1102, as shown in FIGS. 11-11A. Similar to the first seed layer 130, the second seed layer 1104 may include a very thin layer of a barrier-forming material that is conformally deposited on the IC device 100. In a preferred embodiment, the second seed layer 1104 is composed substantially of, if not entirely of, a metal manganese (Mn) film. A thickness of the second seed layer 1104 may be substantially less than the thickness of the third metal liner 1102. According to an embodiment, the second seed layer 1104 may have a thickness of less than approximately 5 nm. In some embodiments, the second seed layer 1104 may have a thickness varying from approximately 0.5 nm to approximately 5 nm. The second seed layer 1104 can be formed by a CVD method using a pyrolysis reaction of a manganese compound gas, a CVD method using a manganese compound gas and a reducing reaction gas, or an ALD method.

Referring now to FIGS. 12-12A, cross-sectional views of the IC device 100 depicting the formation of a second barrier liner 1204 underneath the third metal liner 1102 after a thermal annealing process is shown, according to an embodiment of the present disclosure. FIG. 12A is a cross-sectional view of FIG. 12 taking along the Y-plane. As explained above with reference to FIGS. 1-1A, after depositing the second seed layer 1104 (FIGS. 11-11A), a second thermal annealing process may be performed on the IC device 100. In this embodiment, the IC device 100 is subjected to a high temperature anneal using conventional processes. The annealing temperature may vary from approximately 200° C. to approximately 350° C., although other temperatures above or below this range may also be considered.

As described above with reference to FIG. 1A, the second thermal annealing process may cause atoms of the barrier-forming material in the second seed layer 1104 (FIGS. 11-11A) to migrate through the third metal liner 1102 into the fourth interlevel dielectric layer 1014. Particularly, in this embodiment, manganese (Mn) atoms from the second seed layer 1104 (FIGS. 11-11A) migrate through the third metal liner 1102 to an interface located between a bottom surface of the third metal liner 1102 and the fourth interlevel dielectric layer 1014. As illustrated in FIG. 12A, the manganese (Mn) atoms from the second seed layer 1104 (FIGS. 11-11A) may also migrate through the third metal liner 1102 into the filling material 802 forming the second barrier liner 1204 in areas of the IC device 100 adjacent to the V0 via, as depicted in FIG. 12A.

As previously described, during the (second) thermal anneal process, the migrated manganese (Mn) atoms react with silicon (Si) atoms in the insulating material forming the fourth interlevel dielectric layer 1014 and the filling material 802 forming a barrier material that may prevent the diffusion of conductive metals (e.g., cobalt or copper) from the previously formed metal levels (e.g., M0/V0 level) and oxygen from the different interlevel dielectric layers in the M1 metal layer. For example, in embodiments in which the second seed layer 1104 (FIGS. 11-11A) includes manganese (Mn), and the fourth interlevel dielectric layer 1014 and filling material 802 include silicon dioxide ($SiO_2$), a manganese silicate layer ($MnSiO_3$) may be formed at the $Co/SiO_2$ interface. This manganese silicate layer (e.g., second barrier liner 1204) may improve barrier layer effectiveness, enhance electric stability of the IC device 100, and improve adhesion of the subsequently deposited metal layers.

It should be noted that due to the reduced thickness of the second seed layer 1104 (FIGS. 11-11A), substantially all the material forming the second seed layer 1104 (FIGS. 11-11A) is consumed during the thermal annealing process.

According to an embodiment, the second barrier liner 1204 may have a thickness varying from approximately 0.5 nm to approximately 5 nm and ranges there between, although a thickness less than 0.5 nm and greater than 5 nm may be acceptable.

Figures 13, 13A:
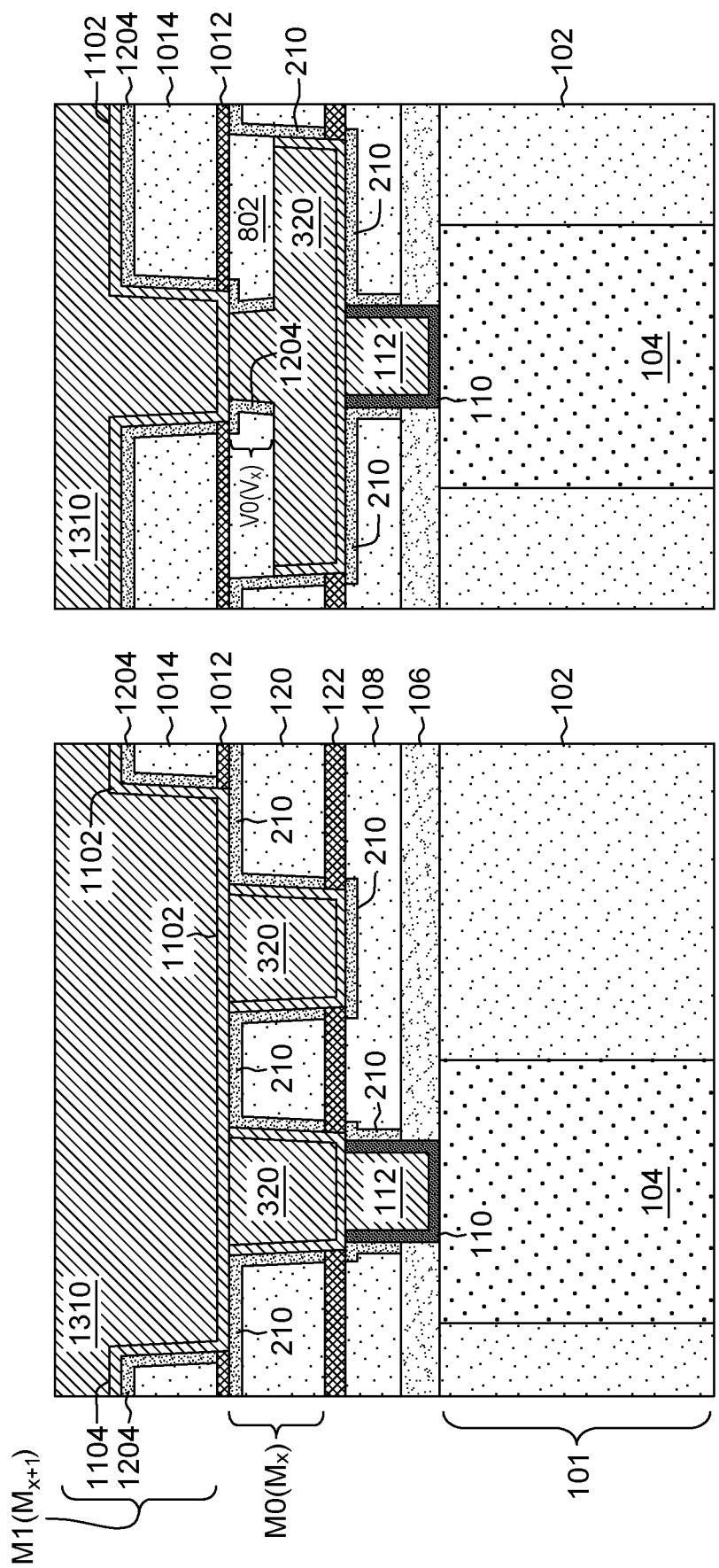
FIG. 13 is a cross-sectional view of the IC device depicting the formation of a second conductive material, according to an embodiment of the present disclosure.
FIG. 13A is a cross-sectional view of FIG. 13 taking along the Y-plane, according to an embodiment of the present disclosure.

Referring now to FIG. 13, a cross-sectional view of the IC device 100 depicting the formation of a second conductive material 1310 is shown, according to an embodiment of the present disclosure. The second conductive material 1310 may be conformally deposited directly above a top surface of the third metal liner 1102. The second conductive material 1310 may be composed of cobalt (Co) or ruthenium (Ru). In another embodiment, the second conductive material 1310 is composed of only copper (Cu). In other embodiments, other metals such as aluminum (Al), gold (Au), silver (Ag) and tungsten (W) may also be considered. In some instances, the second conductive material 1310 may further include dopants such as, for example, manganese, magnesium, copper, aluminum, or other known dopants. The second conductive material 1310 may be formed by electroplating, electroless plating, PVD, CVD, or any combination thereof.

A thickness of the second conductive material 1310 may be enough to entirely fill the second trenches or metal patterns 1020 of FIGS. 12-12A. However, in some embodiments, the thickness of the second conductive material 1310 may exceed the depth of the second trenches or metal patterns 1020 (FIGS. 12-12A) as shown in the figure. In such cases a third planarization process can be conducted in the IC device 100 to remove areas of the second conductive material 1310 exceeding the depth of the second trenches or metal patterns 1020 (FIGS. 12-12A) as will be described in FIG. 14.

Figure 14A:
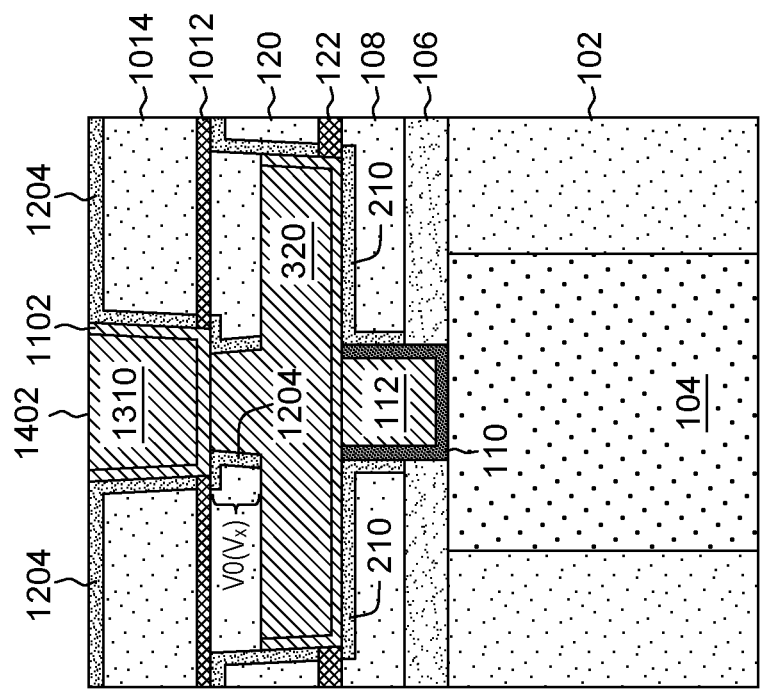
FIG. 14A is a cross-sectional view of FIG. 14 taking along the Y-plane, according to an embodiment of the present disclosure.
Figure 14:
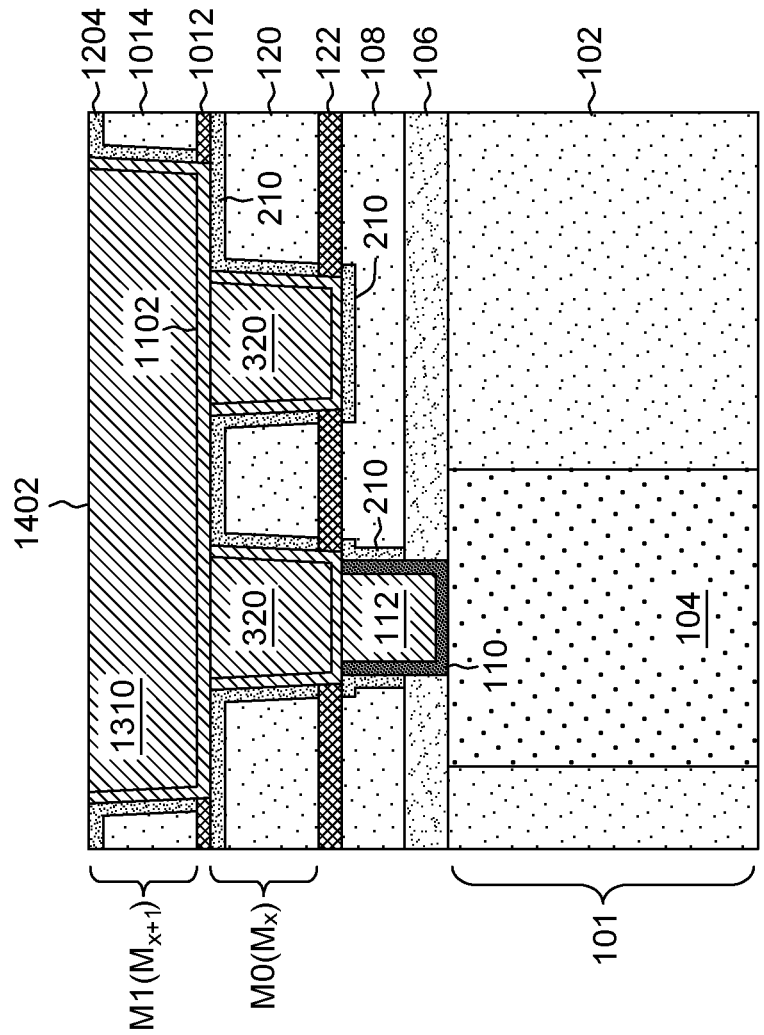
FIG. 14 is a cross-sectional view of the IC after a third planarization process, according to an embodiment of the present disclosure.

Referring now to FIGS. 14-14A, cross-sectional views of the IC device 100 after a planarization process are shown, according to an embodiment of the present disclosure. FIG. 14A is a cross-sectional view of FIG. 14 taking along the Y-plane. Specifically, excess portions of the second conductive material 1310 and portions of the third metal liner 1102 parallel to the fourth interlevel dielectric layer 1014 may be removed from the IC device 100 by any planarization method known in the art including, for example, CMP.

The third metal liner 1102 may also serve as a stop layer during planarization of the excess second conductive material 1310. The third planarization process then may be a two step-process. The first step may include a self-stopping process to remove the excess second conductive material 1310. The second step in the third planarization process may include removing the portions of the third metal liner 1102 parallel to the fourth interlevel dielectric layer 1014, this step exposes a top surface of the second barrier liner 1204, as illustrated in FIGS. 14-14A. According to an embodiment, the second conductive material 1310 and the second third metal liner 1102 form second interconnect structures 1402.

Therefore, embodiments of the present disclosure provide a method and associated structure for reducing the vertical resistance of IC devices by eliminating the typically thicker barrier liner formed during current damascene schemes between the contact structure 112 and M0/V0 and between M0/V0 and M1 metal levels. Stated differently, embodiments of the present disclosure, eliminate the thicker barrier liner typically located at contact to $M_x/V_x$ level to $M_{x+1}$ level in standard damascene schemes. The formation of the manganese seed layer above the metal liner(s) allows for the migration of manganese atoms into the underlying silicon-containing dielectric layer during the high thermal annealing process which causes the (self) formation of a manganese silicate layer that can act as a diffusion barrier without occupying additional space within the interconnect structure. By doing this, vertical resistance of the IC device can be substantially reduced thereby enhancing device performance and reliability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
    an Mx level comprising a first interconnect structure, the first interconnect structure located within a third interlevel dielectric layer, the first interconnect structure comprising:
        a second capping layer underneath the third interlevel dielectric layer,
        a first portion of a second metal liner formed on a bottom portion of the interconnect structure between the second capping layer and on opposing sidewalls of the first interconnect structure directly above a contact structure located underneath the Mx level, a second portion of the second metal liner parallel to and above the third interlevel dielectric layer,
        a first conductive material directly above the first portion of the second metal liner, and
        a first barrier liner formed underneath the second metal liner at an interface between the first portion of the second metal liner and the third dielectric layer and at an interface between the second portion of the second metal liner and the third dielectric layer; and
    an MX+1 level above the MX level, the MX+1 level comprising a second interconnect structure located within a fourth interlevel dielectric layer, the second interconnect structure comprising:
        a third capping layer underneath the fourth interlevel dielectric layer above the Mx level,
        a first portion of a third metal liner formed on a bottom portion of the second interconnect structure and between the second capping layer and on opposing sidewalls of the second interconnect structure, a second portion of the third metal liner parallel to and above the fourth interlevel dielectric layer, the first portion of the third metal liner formed on the bottom portion of the second interconnect structure being above the first interconnect structure,
        a second conductive material directly above the first portion of the third metal liner, and
        a second barrier liner formed at an interface between the first portion of the third metal liner and the fourth dielectric layer and at an interface between the second portion of the second metal liner and the fourth dielectric layer.

2. The semiconductor device of claim 1, wherein the first conductive material and the second conductive material comprise at least one of cobalt and ruthenium.

3. The semiconductor device of claim 1, wherein the first conductive material comprises cobalt and the second conductive material comprises copper.

4. The semiconductor device of claim 1, wherein:
    the first barrier liner comprises a first manganese silicate barrier formed during a first thermal annealing process in which first manganese atoms from a first seed layer above the second metal liner migrate through the second metal liner into the interface between the first portion of the second metal liner and the third dielectric layer and into the interface between the second portion of the second metal liner and the third dielectric layer, and
    the first manganese atoms from the first seed layer react with silicon atoms in the third interlevel dielectric layer to form the first barrier liner, the first seed layer comprises a thickness of less than 3 nm that allows for the first seed layer to be completely consumed during the first thermal annealing process.

5. The semiconductor device of claim 1, wherein:
    the second barrier liner comprises a second manganese silicate barrier formed during a second thermal annealing process in which second manganese atoms from a second seed layer above the third metal liner migrate through the third metal liner into the interface between the first portion of the third metal liner and the fourth dielectric layer and into the interface between the second portion of the third metal liner and the fourth dielectric layer, and
    the second manganese atoms from the second seed layer react with silicon atoms in the fourth interlevel dielectric layer to form the second barrier liner, the second seed layer comprises a thickness of less than 3 nm that allows for the second seed layer to be completely consumed during the second thermal annealing process.

6. The semiconductor device of claim 4, wherein:
    the contact structure is formed within a second interlevel dielectric layer in contact with a bottom surface of the first interconnect structure, the contact structure electrically connected to a field effect transistor device located within a first interlevel dielectric layer below the contact structure, wherein the first barrier liner is formed on an interface between the contact structure and the second interlevel dielectric layer during the first thermal annealing process in which the manganese atoms from the first seed layer migrate to areas of the contact structure in direct contact with the second interlevel dielectric layer and react with silicon atoms in the second interlevel dielectric layer.

* * * * *